United States Patent [19]

Prudhon et al.

[11] 4,127,750

[45] Nov. 28, 1978

[54] APPARATUS FOR TRANSMITTING AND RECEIVING PULSES

[75] Inventors: Lucien P. E. Prudhon, Soisy-sur-Seine; Jean P. G. Charil, Clamart, both of France

[73] Assignee: Association des Ouvriers en Instruments de Precision, Paris, France

[21] Appl. No.: 731,762

[22] Filed: Oct. 12, 1976

Related U.S. Application Data

[63] Continuation-in-part of Ser. No. 516,575, Oct. 21, 1974, Pat. No. 4,001,524, which is a continuation of Ser. No. 319,168, Dec. 29, 1972, abandoned.

[30] Foreign Application Priority Data

Jan. 4, 1972 [FR] France .............................. 72.00102
Dec. 8, 1972 [FR] France .............................. 72.43763
Nov. 14, 1975 [FR] France .............................. 75 34824

[51] Int. Cl.$^2$ ............................................ H04B 1/58
[52] U.S. Cl. ............................. 179/170 R; 179/15 A
[58] Field of Search ............ 179/15 A, 15 BL, 170 R, 179/170 D, 170 NC, 170 T, 170.2, 170.8, 2.5 R, 81 A

[56] References Cited

U.S. PATENT DOCUMENTS

| 2,950,361 | 8/1960 | Geiser | 179/170 NC |
| 3,180,947 | 4/1965 | Haselton | 179/170 NC |
| 3,480,742 | 11/1969 | Gaunt | 179/170 NC |
| 3,586,881 | 6/1971 | Gaunt | 179/170 NC |
| 3,603,744 | 9/1971 | Krasin | 179/170.8 |

Primary Examiner—Kathleen H. Claffy
Assistant Examiner—Joseph A. Popek
Attorney, Agent, or Firm—Karl F. Ross

[57] ABSTRACT

The present invention relates to an apparatus for transmitting and receiving coded telephone pulses. This apparatus includes a modulation channel and a demodulation channel which are connected to a telephone instrument via a subscriber line and a duplexer, including an operational amplifier, for separating the transmitted and received signals. The demodulation channel of this apparatus comprises a demodulator whose output is connected to an active demodulating filter of the Sallen-Key type having a low-pass-type response curve adapted to compensate the distortion resulting from the demodulation.

28 Claims, 2 Drawing Figures

APPARATUS FOR TRANSMITTING AND RECEIVING PULSES

CROSS-REFERENCE TO RELATED APPLICATIONS

This is a continuation-in-part of our copending application Ser. No. 516,575, now U.S. Pat. No. 4,001,524, filed Oct. 21, 1974 as a continuation of application Ser. No. 319,168 which was filed Dec. 29, 1972 and is now abandoned.

FIELD OF THE INVENTION

Our present invention relates to apparatus for transmitting and receiving coded telephone pulses.

BACKGROUND OF THE INVENTION

The PCM (pulse-code-modulation) telecommunication system described in our copending application and patent comprises a modulation channel for converting low-frequency signals originating at a subscriber line into outgoing code pulses, a demodulation channel for converting incoming code pulses into low-frequency signals to be transmitted to that subscriber line, and duplexing means for coupling the two channels to the subscriber line while decoupling them from each other. An active filter inserted in at least one of the channels also functions as an amplifier either for the outgoing or for the incoming signals.

OBJECTS AND SUMMARY OF THE INVENTION

The general object of the present invention is to provide an improved active filter for modulation or demodulation and an improved duplexer for the apparatus described in our U.S. Pat. No. 4,001,524.

According to a feature of the present invention we provide an improved active demodulating filter of the Sallen-Key type having a low-pass-type response curve adapted to compensate for the $(\sin \omega\tau/2)/\omega\tau/2$ distortion which results from the demodulation, $\omega$ being the angular frequency of the low-frequency signal to be demodulated and $\tau$ being the duration of each signal sample. This improvement is particularly advantageous in that it enables demodulation distortion to be eliminated in a very effective manner.

According to a more particular feature of the present invention, the active demodulating filter comprises three active structures of the Sallen-Key type, of the second order, these structures comprising each a low-consumption operational amplifier and being connected in series. Preferably the output structure has a Q value higher than that of the input structure and lower than that of the intermediate structure. Advantageously, the active demodulating filter further comprises, upstream of its input structure and in cascade therewith, an operational amplifier which is connected as an active attenuator and whose gain is adjusted according to the gains of the amplifiers in the three Sallen-Key-type structures.

A further feature of the present invention resides in the provision of improved duplexing means, comprising a matching resistor inserted between the demodulation channel and the subscriber line, an operational amplifier having a first (e.g. noninverting) and a second (e.g. inverting) input and an output connected to the modulation channel, a compensating network inserted between the demodulation channel and the first input of the operational amplifier, this network compensating for impedance variations in the subscriber line, and a voltage divider inserted between the subscriber line and the output of the operational amplifier. An intermediate point of the voltage divider, connected to the second input of the operational amplifier, is so selected that a signal arriving from the demodulation channel results in a substantially zero voltage output of the said operational amplifier, thanks to the relative signal inversion occurring between the two inputs. In this way, the signal arriving from the demodulation channel is transmitted through the matching resistor to the subscriber line with a suitable impedance while the output of the operational amplifier transmits scarcely any signal to the modulation channel. On the other hand, the operational amplifier transmits a signal arriving from the subscriber line to the modulation channel with a predetermined gain while correcting the frequency band of this signal so that variations in the electrical characteristics of the line are compensated.

In an advantageous embodiment of the present invention, the compensating network comprised in the improved duplexing means consists of a first and of a second circuit of the RC type, connected in series, which are separately adjusted so as to compensate for line-impedance variations at low high voice frequencies, respectively. Preferably, each RC circuit is formed by a series branch consisting of a resistance and a capacitance in parallel, and a shunt branch consisting only of a resistance.

A still further object of the present invention is to provide means for reducing the electrical-power consumption of each of the various circuits of the apparatus while at that time adjusting the said consumption to a value suitable to allow the corresponding circuit to operate under optimum conditions that while still letting the various circuits — in particular the operational amplifiers — be formed by standard integrated circuits, preferably of one and the same type with low consumption. To this end we provide the operational amplifier with consumption-adjusting means which may consist of resistors of suitably selected values. A common standard type of operational amplifier may thus be used for example both in the duplexing means and in the active modulating and demodulating filters, the consumption of each operational amplifier being set to the minimum level compatible with the satisfactory operation of the corresponding circuit by suitably adjusting the values of these resistors.

The electrical consumption of each of the active modulation and demodulating filters of the apparatus according to the present invention, particularly in the quiescent state, may also be reduced by impedance means, such as resistors of suitably adjusted values, connected to at least one of the operational amplifiers of the active filters to adjust the offset voltage of that amplifier so as to obtain a very low d.c. voltage on the output of the corresponding active filter. The result is obviously a very low consumption of d.c. electrical energy in the impedance which is connected to the output of that active filter.

BRIEF DESCRIPTION OF THE DRAWING

By way of illustration, an embodiment of the present invention is described below and illustrated schematically in the accompanying drawing in which.

SPECIFIC DESCRIPTION

Figure 1:
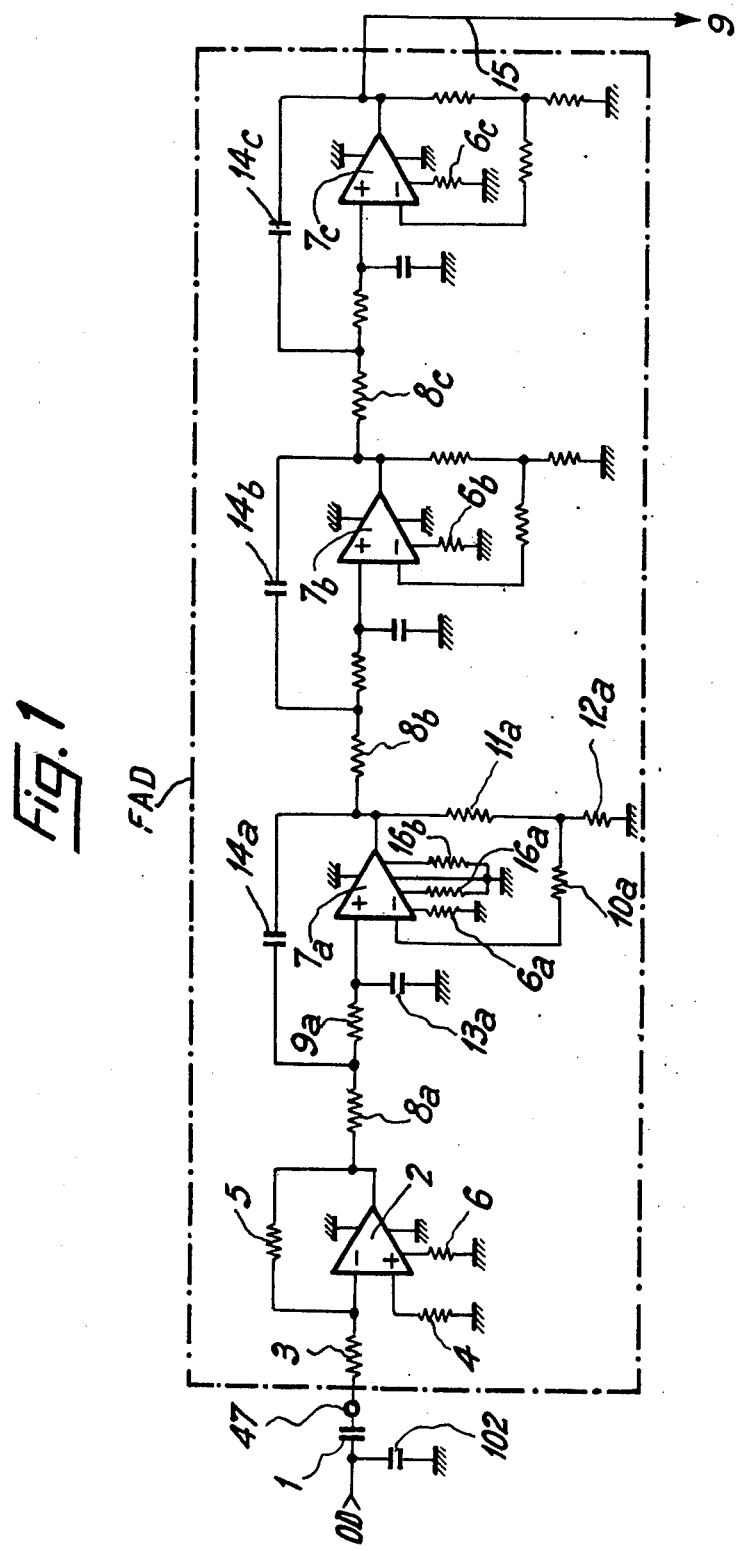
FIG. 1 is a circuit diagram of an active demodulating filter according to the present invention.

In FIG. 1, reference numeral 47 designates (as in our issued patent) the input terminal of an active demodulating filter FAD according to the invention. This input terminal 47 of the active demodulating filter FAD is connected, via a coupling capacitor 1 in series therewith, on the one hand to a demodulation bus OD (see patent) and on the other hand to one of the terminals of a storage capacitor 102 whose other terminal is grounded and which acts as a detector or amplitude demodulator. In other words, the periodic amplitude-modulated pulses received via bus OD are stored on capacitor 102, whose charge voltage thus varies in the course of time along a stepped ramp while its AC component is transmitted by the coupling capacitor 1 to the input terminal 47.

The active demodulating filter FAD which is shown diagrammatically in FIG. 1 has an input stage formed in essence by an operational amplifier 2 of low electrical consumption which is preferably of a standard type such as the type known by the Ser. No. 776. The operational amplifier 2 is connected as an active attenuator. Its inverting input is connected to terminal 47 via a resistor 3 of suitable value, while its noninverting input is grounded via a resistor 4. Because of the coupling or blocking capacitor 1, no d.c. voltage which might possibly be transmitted from the bus OD is able to upset the operation of operational amplifier 2. A feedback resistor 5 is connected between the output of operational amplifier 2 and its inverting input. In addition, the operational amplifier 2 is of a type whose electrical consumption can be adjusted by means of a resistor 6 whose value is chosen to allow the amplifier 2 to have the minimum consumption compatible with satisfactory operation of the input stage of active filter FAD. The operational amplifier 2 and the resistors 3 to 6 preferably form a solid-state integrated circuit in which the resistors may for example take the known form of resistive tracks. The value of resistor 6 may be adjusted, for the purpose mentioned above, by suitably altering at least one of its transverse dimensions, using for example an automatically controlled laser beam.

The next three stages of the active filter FAD, which are connected in series with one another and with the operational input amplifier 2, each contain an operational amplifier, 7a, 7b, or 7c, which may be of the same type as operational amplifier 2. Each stage also includes five resistors, such as 8a to 12a, and two capacitors, such as 13a and 14a, which are connected to the noninverting and inverting inputs of the corresponding operational amplifier, such as 7a, and to its output in such a way as to form with the amplifier a second-order structure of the so-called Sallen-Key type whose Q value is determined by the values selected for the various components 8a to 14a. The three Sallen-Key structures, which are connected in series, have their components so selected that the output structure 7c to 14c has a Q value which is higher than that of the input structure 7a to 14a and lower than that of the intermediate structure 7b to 14b. Since each of the three Sallen-Key structures is of the second order, when connected in series they form an active filter of the sixth order which has a response curve of the low-pass type and compensates for the (sin $\omega\tau/2$)/$\omega\tau/2$ distortion which is due to the demodulation ($\omega$ being the angular frequency of the low-frequency signal and $\tau$ being the duration of the signal sample). By virtue of these characteristics of the active demodulating filter FAD according to the present invention, the filtered and amplified signal which appears on the output line 15 from the active filter FAD shows very little distortion.

The active filter formed by the three Sallen-Key structures described above has an amplitude/frequency curve which can be adjusted by varying, e.g. by the laser-beam method indicated above, the values of at least some of the resistive components of the three structures in order to compensate for possible deviations of the capacitive components such as 13a and 14a or of the parameters of the operational amplifiers such as 7a from their rated values and thus to obtain the desired variation of amplitude as a function of frequency. The overall gain of the active filter FAD, on the other hand, is adjusted by regulating the gain of the input stage 2 to 6, which is also done by varying the values of its resistive components. The gain of the active filter FAD is for example selected to be equal to 1. It is particularly advantageous to adjust the resistive components in each stage of the active filter FAD according to the present invention independently of the adjustments of the resistive components in its other stages, since this allows the filter FAD to be adjusted more quickly while preventing adjustments of one stage from upsetting those made previously to another stage.

As indicated above, the operational amplifiers 7a to 7c are also of a type having low electrical consumption which may be adjusted to the minimum value compatible with the proper operation of each Sallen-Key structure by adjusting the value of a resistor 6a, 6b or 6c.

In accordance with another feature of the invention, we provide the operational amplifier 7a in the input structure 7a to 14a of the active filter FAD with means for adjusting the offset voltage of amplifier 7a so as to obtain a very low d.c. voltage on the output line 15 from filter FAD. In the embodiment shown in FIG. 1, these means take the form of two resistors 16a and 16b which are connected to respective inputs of the operational amplifier 7a and whose values are adjusted, for example by the laser-beam technique mentioned above, so as to minimize the offset voltage of amplifier 7a. By this means it is possible to ensure that in the quiescent state, that is to say when there is no signal at input termimal 47 of the active filter FAD, the output line 15 of the filter feeds a very low current into the impedance which is connected to it.

The output line 15 of the active demodulating filter FAD is connected to the input terminal 9 of an electronic switch or duplexing device AG (FIG. 2) whose other input terminal 9' is grounded. A telephone subscriber line, which is not shown, is connected to two other terminals 7 and 7' of the electronic switch AG, terminal 7' being likewise connected to ground. A resistor 17 inserted between the input terminals 7 and 9 of the electronic switch AG, that is to say between the telephone line and the demodulating channel, serves to match the impedances of the telephone line and the demodulation channel to each other.

The electronic switch or duplexer AG also includes an operational amplifier 18 which may be of the same type as the operational amplifiers 2 and 7a to 7c (FIG. 1). The amplifier 18 has a resistor 6d for adjusting its electrical consumption. The output of operational amplifier 18 is connected to the first of the two output terminals, 8 and 8', of the electronic switch AG. Output terminal 8, is connected to the demodulation channel which will be described below, terminal 8' being grounded. Between the first, noninverting input of the operational amplifier 18 and the input terminal 9 of the electronic switch AG, which is connected to the output line 15 of the active demodulating filter FAD, there is inserted a network for compensating any impedance variations in the telephone line. In the embodiment shown in FIG. 2, this compensating network consists of two circuits of the RC type connected in series, which can be separately adjusted so as individually to compensate for line-impedance variations at low voice frequencies and at high voice frequencies, respectively. In particular, each of the two RC circuits has a series branch, formed by a resistor 19a or 19b in parallel with a capacitor 20a or 20b, this series branch being followed by a shunt resistor 21a or 21b. The values of the various components 19a to 21a and 19b to 21b and thus of the time constants of the two cascaded RC circuits are so selected that the compensating has the same frequency-response curve as the dipole connected to the input terminals 7 and 7', i.e. the telephone line. Since the line impedance varies within wide limits not only as a function of the frequency of the telephone signals but also as a function of the state of the line and in particular of the position of the telephone set to which it is connected, the compensating network which has just been described efficiently attenuates the effect of the line-impedance variations on the signals to be transmitted to the modulation channel through the electronic switch AG.

The second, inverting input of operational amplifier 18 is connected to an intermediate point 22 of a voltage divider which is formed by two resistors 23a and 23b connected in series with one another and inserted between the input terminal 7 of the electronic switch AG which is connected to the telephone line and the output of operational amplifier 18, resistor 23a lying in the feedback circuit of this amplifier. The ratio of the values of resistors 23a and 23b is so selected that a signal arriving at the input terminal 9 of the electronic switch AG from the demodulation channel, which is transmitted to the telephone line through matching resistor 17 and terminal 7, produces virtually no voltage at the output of operational amplifier 18, so that switch AG thus transmits virtually no signal to the modulation channel which is connected to its output terminals 8 and 8'. This signal is split into two paths traveling via respective branches 17, 23b and 19a, 19b of a resistance network within duplexer AG to the inverting and the noninverting amplifier inputs so as to balance each other. Conversely, a telephone signal which is transmitted to terminals 7 and 7' from the telephone line is retransmitted, in an unbalanced manner, via resistor 23b to the inverting input and via matching resistor 17 and network resistors 19a, 19b to the noninverting input of operational amplifier 18 so as to appear on the output terminals 8, 8' of the electronic switch AG and thus in the modulation channel with, possibly, a predetermined gain. On the other hand, the telephone signal arriving at the input terminals 7, 7' of the electronic switch AG cannot be transmitted through matching resistor 17 and terminal 9 to the demodulation channel comprising the active filter FAD (FIG. 1), owing to the fact that line 15 terminates at the output of operational amplifier 7c (FIG. 1).

For the telephone signal which arrives from the line, electronic switch AG operates as an amplifier whose gain can be adjusted by changing the values of the various resistive components and in particular that of the two resistors 23a and 23b. A value of 1 is preferably selected for the gain of the electronic switch AG. One of the advantages of the apparatus according to the invention lies in the independence of the adjustable components which form part of the modulation channel and the demodulation channel, respectively, which enables the two channels to be adjusted independently of one another.

It will thus be seen that duplexer AG, lying between a first terminal 7, a second terminal 8 and a third terminal 9, forms an incoming-signal path from third terminal 9 to first terminal 7 via resistor 17, an outgoing-signal path from first terminal 7 to second terminal 8 via resistor 23b and amplifier 18, and a balancing-signal path from third terminal 9 to second terminal 8 via resistors 19a, 19b and amplifier 18. The transmission of line signals from terminal 7 to demodulation bus OD is blocked by the one-way amplifiers in active filter FAD.

Figure 2:
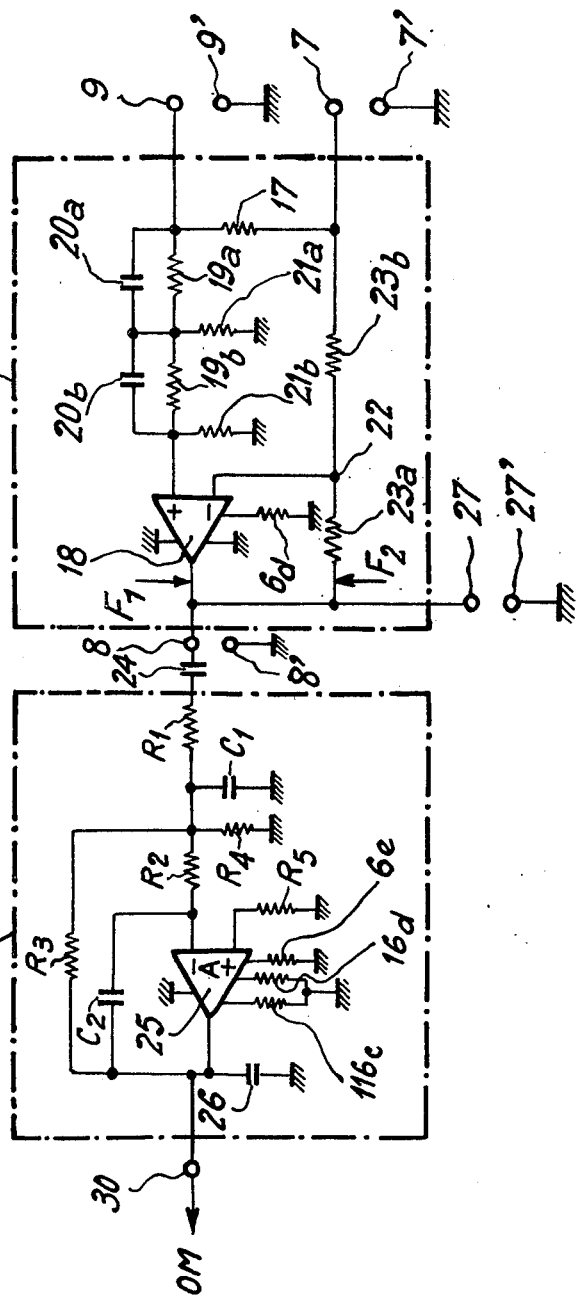
FIG. 2 is a circuit diagram of an electronic switch or duplexer and an active modulating filter according to the present invention.

The input of the active modulating filter FAM, which is shown schematically in the left-hand part of FIG. 2, is coupled to the output 8 of electronic switch AG by a series capacitor 24, the purpose of which is to prevent transmission to the active modulating filter FAM of a d.c. voltage liable to upset the operation of the modulating bus OM which is connected to the output terminal 30 of the active filter FAM as shown in our prior patent.

Although the apparatus so far described may comprise any suitable type of active modulating filter, we prefer to design this filter FAM as shown in the left-hand part of FIG. 2, i.e. with its chief component constituted by an operational amplifier 25 having low electrical consumption, which may be of the same type as the operational amplifiers 2, 7a to 7c and 18 mentioned above. Like them, it has a resistor 6e whose value is adjusted, for example by the laser-beam method mentioned above, in such a way as to bring the electrical consumption of the operational amplifier 25 to the minimum level compatible with proper operation of this modulating filter FAM. Also associated with operational amplifier 25 are two resistors 16c and 16d which enable its offset voltage to be adjusted in such a way as to obtain a very low d.c. voltage at the output 30 of the active filter FAM, for the reasons mentioned above. The gain of the active modulating filter FAM may be adjusted to a preferred value of 2.

A capacitor 26 shunts the output terminal 30 of active filter FAM to ground. This capacitor 26 performs the function of an electrical-energy store for the current peaks which occur in the operation of a sampling gate; such a gate may be inserted between the output terminal 30 of the active filter FAM and the modulation bus OM, as illustrated in FIG. 12 of our U.S. Pat. No. 4,001,524. This arrangement is made necessary by the fact that the steps taken to limit the electrical consumption of the operational amplifier 25 in the active filter FAM may result in preventing it from supplying the full energy required to generate the aforementioned current peaks.

The apparatus shown in FIGS. 1 and 2, although designed with a view to being connected to a two-wire telephone line, may easily be adapted for connection to a four-wire telephone line. For this purpose it is merely necessary to cut the output connections of electronic switch AG where indicated by arrows F1 and F2. The two incoming-signal wires of the telephone line are then connected to terminals 7, 7' of the electronic switch, so that they will receive signals transmitted by the active demodulating filter FAD without amplification, since the overall gain of the active filter FAD is 1. The outgoing-signal wires of the telephone line on the other hand are connected, via an attenuator and a coupling transformer, to terminals 27, 27', terminal 27' being grounded while terminal 27 is connected to the modulation channel via the output terminal 8 of electronic switch AG and capacitor 24. The attenuator mentioned is so adjusted as preferably to compensate for the gain, of value 2, of the active modulating filter FAM.

As already mentioned, the values of all the resistive components of the various circuits in the apparatus according to the present invention may be adjusted by using a laser beam automatically controlled to compensate for the tolerances of the capacitive components and of the parameters of the amplifiers included in these circuits.

What is claimed is:

1. In a pulse-code-modulation telecommunication system comprising a subscriber line, a modulation channel for forming samples of low-frequency signals originating at said subscriber line and for converting said samples into outgoing code pulses, a demodulation channel for converting incoming code pulses into low-frequency signals to be transmitted to said subscriber line, and duplexing means for coupling said channels to said subscriber line while decoupling said channels from each other, the improvement wherein said demodulation channel includes detector means followed by active filter means of the Sallen-Key type having an amplitude/frequency response of low-pass type compensating for the $(\sin \omega\tau/2)/\omega\tau/2$ distortion due to the conversion of said incoming code pulses, $\omega$ being the angular frequency of the low-frequency signals transmitted to said subscriber line and $\tau$ being the duration of each of said samples.

2. The improvement defined in claim 1 wherein said active filter means is of the sixth order.

3. The improvement defined in claim 1 wherein said active filter means comprises an input structure, an intermediate structure and an output structure connected in series, each of said structures comprising an operational amplifier connected as a second-order Sallen-Key filter.

4. The improvement defined in claim 3 wherein said output structure has a Q value higher than that of said input structure and lower than that of said intermediate structure.

5. The improvement defined in claim 3 wherein said active filter means further comprises an additional operational amplifier inserted between said detector means and said input structure, said additional operational amplifier being connected as an attenuator.

6. The improvement defined in claim 5 wherein the combined gain of all said operational amplifiers is unity.

7. The improvement defined in claim 3 wherein each of said operational amplifiers is provided with impedance means for individually adjusting the power consumption tnereof.

8. The improvement defined in claim 1, further comprising a blocking capacitor inserted between said detector means and said active filter means.

9. In a PCM telecommunication system, in combination:

a subscriber line provided with a first terminal;

a modulation channel for forming samples of low-frequency signals originating at said subscriber line and for converting said samples into outgoing code pulses, said modulation channel being provided with a second terminal;

an active filter in said modulating channel including a first operational amplifier;

a demodulation channel for converting incoming code pulses into low-frequency signals to be transmitted to said subscriber line, said demodulation channel including detector means and being provided with a third terminal connected to an output of said detector means;

an active filter in said demodulation channel including a second operational amplifier;

duplexing means for coupling said channels to said subscriber line while decoupling said channels from each other, said duplexing means comprising a resistance network forming an incoming-signal path from said third terminal to said first terminal, an outgoing-signal path from said first terminal to said second terminal, and a balancing-signal path from said third terminal to said second terminal for canceling the transmission of signals from said demodulation channel to said modulation channel via said incoming-signal and outgoing-signal paths in series; and signal-amplifying means inserted between said detector means and said third terminal for preventing the transmission of signals from said first terminal to said detector means via said incoming-signal path.

10. The combination defined in claim 9 wherein at least one of said operational amplifiers is provided with impedance means for adjusting the offset voltage thereof to minimize its d-c output voltage.

11. In a PCM telecommunication system, in combination:

a subscriber line provided with a first terminal;

a modulation channel for forming samples of low-frequency signals originating at said subscriber line and for converting said samples into outgoing code pulses, said modulation channel being provided with a second terminal;

a demodulation channel for converting incoming code pulses into low-frequency signals to be transmitted to said subscriber line, said demodulation channel including detector means and being provided with a third terminal connected to an output of said detector means;

duplexing means for coupling said channels to said subscriber line decoupling said channels from each other, said duplexing means comprising a resistance network forming an incoming-signal path from said third terminal to said first terminal, an outgoing-signal path from said first terminal to said second terminal, and a balancing-signal path from said third terminal to said second terminal for canceling the transmission of signals from said demodulation channel to said modulation channel via said incoming-signal and outgoing-signal paths in series; and signal-amplifying means inserted between said detector means and said third terminal for preventing the transmission of signals from said first terminal to said detector means via said incoming-signal path, said signal-amplifying means including active filter means of the Sallen-Key type having an amplitude/frequency response of low-pass type compensating for the (sin $\omega\tau/2$)/$\omega\tau/2$ distortion due to the conversion of said incoming code pulses, $\omega$ being the angular frequency of the low-frequency signals transmitted to said subscriber line and $\tau$ being the duration of each of said samples.

12. The combination defined in claim 11 wherein said active filter means is of the sixth order.

13. The combination defined in claim 11 wherein said activer filter means comprises an input structure, an intermediate structure and an output structure connected in series, each of said structures comprising an operational amplifier connected as a second-order Sallen-Key filter.

14. The combination defined in claim 13 wherein said active filter means further comprises an additional operational amplifier inserted between said detector means and said input structure, said additional operational amplifier being connected as an attenuator.

15. The combination defined in claim 14 wherein the combined gain of all said operational amplifiers is unity.

16. The combination defined in claim 11, further comprising a blocking capacitor inserted between said detector means and said active filter means.

17. In a PCM telecommunication system, in combination:
   a subscriber line provided with a first terminal;
   a modulation channel for forming samples of low-frequency signals originating at said subscriber line and for converting said samples into outgoing code pulses, said modulation channel including an active filter and being provided with a second terminal and with a series capacitor inserted between said active filter and said second terminal;
   a demodulation channel for converting incoming code pulses into low-frequency signals to be transmitted to said subscriber line, said demodulation channel including detector means and being provided with a third terminal connected to an output of said detctor means;
   duplexing means for coupling said channels to said subscriber line while decoupling said channels from each other, said duplexing means comprising a resistance network forming an incoming-signal path from said third terminal to said first terminal, an outgoing-signal path from said first terminal to said second terminal, and a balancing-signal path from said third terminal to said second terminal for canceling the transmission of signals from said demodulation channel to said modulation channel via said incoming-signal and outgoing-signal paths in series; and
   signal-amplifying means inserted between said detector means and said third terminal for preventing the transmission of signals from said first terminal to said detector means via said incoming-signal path.

18. In a PCM telecommunication system, in combination:
   a subscriber line provided with a first terminal;
   a modulation channel for forming samples of low-frequency signals originating at said subscriber line and for converting said samples into outgoing code pulses, said modulation channel being provided with a second terminal;
   a demodulation channel for converting incoming code pulses into low-frequency signals to be transmitted to said subscriber line, said demodulation channel including detector means and being provided with a third terminal connected to an output of said detector means;
   duplexing means for coupling said channels to said subscriber line while decoupling said channels from each other, said duplexing means comprising a resistance network forming an incoming-signal path from said third terminal to said first terminal, an operational amplifier inserted between said network and said modulation channel, said operational amplifier having an output connected to said second terminal and further having an inverting input and a noninverting input, an outgoing-signal path from said first terminal to said second terminal, said outgoing signal path including a first branch of said network extending to one of said inputs, and a balancing-signal path from said third terminal to said second terminal for canceling the transmission of signals from said demodulation channel to said modulation channel via said incoming-signal and outgoing-signal paths in series, said balancing-signal path including a second branch of said network extending to the other of said inputs; and
   signal-amplifying means inserted between said detector means and said third terminal for preventing the transmission of signals from said first terminal to said detector means via said incoming-signal path.

19. The combination defined in claim 18 wherein said network includes an impedance-matching resistor in said incoming-signal path.

20. The combination defined in claim 18 wherein said operational amplifier has a feedback resistor inserted between its output and its inverting input, said first branch comprising another resistor forming a voltage divider with said feedback resistor while lying between said first terminal and said inverting input.

21. The combination defined in claim 18 wherein said second branch comprises a pair of cascaded RC circuits of different time constants compensating for line-impedance variations at high and low voice frequencies, respectively.

22. The combination defined in claim 21 wherein each of said RC circuits comprises a series resistor, a shunt resistor and a capacitor in parallel with said series resistor.

23. The combination defined in claim 18 wherein said operational amplifier is provided with impedance means for adjusting the power consumption thereof.

24. In a pulse-code-modulation telecommunication system comprising a subscriber line, a modulation channel for converting low-frequency signals originating at said subscriber line into outgoing code pulses, a demodulation channel for converting incoming code pulses into low-frequency signals to be transmitted to said subscriber line, and duplexing means for coupling said channels to said subscriber line while decoupling said channels from each other,
   the improvement wherein said duplexing means comprises an operational amplifier having an output connected to said modulation channel and further having an inverting input and a noninverting input, first resistance means forming an incoming-signal path from said demodulation channel to said subscriber line, second resistance means connected to one of said inputs and forming an outgoing-signal path from said subscriber line to said modulation channel, and third resistance means connected to the other of said inputs and forming a balancing-signal path from said demodulation channel to said modulation channel for canceling the transmission of signals from said demodulation channel to said modulation channel via said incoming-signal and outgoing-signal paths in series, said demodulation channel including one-way amplification means blocking the transmission of signals coming from said subscriber line.

25. The improvement defined in claim 24 wherein said third resistance means comprises a pair of series resistors forming part of two cascaded RC circuits of different time constants compensating line-impedance variations of high and low voice frequencies, respectively.

26. The improvement in claim 25 wherein each of said RC circuits comprises a capacitor bridging the respective series resistor and a shunt resistor connected to a junction of said capacitor and respective series resistor.

27. The improvement defined in claim 24 wherein said operational amplifier has a feedback resistor inserted between its output and its inverting input, said second resistance means being connected to said inverted input and forming a voltage divider with said feedback resistor.

28. In a PCM telecommunication system, in combination:
a resistor line provided with a first terminal;
a modulation channel for converting low-frequency signals originating at said subscriber line into outgoing code pulses, said modulation channel being provided with a second terminal;
a demodulation channel for converting incoming code pulses into low-frequency signals to be transmitted to said subscriber line, said demodulation channel including detector means and being provided with a third terminal connected to an output of said detector means;
duplexing means for coupling said channels to said subscriber line while decoupling said channels from each other, said duplexing means comprising a resistance network forming an incoming-signal path from said third terminal to said first terminal, an outgoing-signal path from said first terminal to said second terminal, and a balancing-signal path from said third terminal to said second terminal for canceling the transmission of signals from said demodulation channel to said modulation channel via said incoming-signal and outgoing-signal paths in series; and
active filter means including an operational amplifier inserted between said detector means and said third terminal for preventing the transmission of signals from said first terminal to said detector means via said incoming-signal path while compensating for signal distortions occurring in said demodulation channel.

* * * * *